(12) United States Patent
Meynants (10) Patent No.: US 11,910,111 B2
(45) Date of Patent: Feb. 20, 2024

(54) PIXEL CELL AND METHOD FOR OPERATING A PIXEL CELL

(71) Applicant: ams Sensors Belgium BVBA, Antwerp (BE)

(72) Inventor: Guy Meynants, Eindhoven (NL)

(73) Assignee: AMS SENSORS BELGIUM BVBA, Antwerp (BE)

( * ) Notice: Subject to any disclaimer, the term of this patent is extended or adjusted under 35 U.S.C. 154(b) by 0 days.

(21) Appl. No.: 17/264,668

(22) PCT Filed: Jul. 17, 2019

(86) PCT No.: PCT/EP2019/069266
§ 371 (c)(1),
(2) Date: Jan. 29, 2021

(87) PCT Pub. No.: WO2020/025328
PCT Pub. Date: Feb. 6, 2020

(65) Prior Publication Data
US 2021/0235027 A1     Jul. 29, 2021

(30) Foreign Application Priority Data
Aug. 3, 2018   (EP) .................................... 18187322

(51) Int. Cl.
*H04N 25/531*     (2023.01)
*H04N 25/75*     (2023.01)
(Continued)

(52) U.S. Cl.
CPC ........... *H04N 25/531* (2023.01); *H04N 25/75* (2023.01); *H04N 25/771* (2023.01);
(Continued)

(58) Field of Classification Search
CPC .. H04N 5/353; H04N 5/3532; H04N 5/37452; H04N 5/37457; H04N 5/378;
(Continued)

(56) References Cited

U.S. PATENT DOCUMENTS

| | | | |
|---|---|---|---|
| 8,569,671 B2 * | 10/2013 | Meynants | ............ H04N 5/3575 |
| | | | 250/214 R |
| 8,754,357 B2 | 6/2014 | Meynants et al. | |

(Continued)

FOREIGN PATENT DOCUMENTS

| | | |
|---|---|---|
| CN | 106385538 A | 2/2017 |
| CN | 108200367 A | 6/2018 |

(Continued)

OTHER PUBLICATIONS

I. Oshiyama et al., "Near-infrared sensitivity enhancement of a back-illuminated complementary metal oxide semiconductor image sensor with a pyramid surface for diffraction structure," 2017 IEEE International Electron Devices Meeting (IEDM), 2017, pp. 16.4.1-16.4.4, doi: 10.1109/IEDM.2017.8268403. (Year: 2017).*

(Continued)

*Primary Examiner* — Lin Ye
*Assistant Examiner* — Chriss S Yoder, III
(74) *Attorney, Agent, or Firm* — MH2 TECHNOLOGY LAW GROUP LLP (57) ABSTRACT

A pixel cell includes a pixel set with a plurality of pixels, with each pixel of the pixel set being configured to capture optical information incident upon the respective pixel and generate electrical information representative of the optical information. The pixel cell further includes a readout circuit which is configured to manage collection and output of the electrical information from each pixel of the pixel set and to operate the pixel set in a global shutter mode and in a rolling shutter mode of operation. In the global shutter mode, the (Continued)

electrical information from each pixel is combined for generating a global shutter output signal, while in the rolling shutter mode, the electrical information from each pixel is used to generate individual rolling shutter output signals.

16 Claims, 6 Drawing Sheets

(51) Int. Cl.
*H04N 25/771* (2023.01)
*H01L 27/146* (2006.01)
*H04N 25/778* (2023.01)

(52) U.S. Cl.
CPC .... *H01L 27/1464* (2013.01); *H01L 27/14621* (2013.01); *H01L 27/14625* (2013.01); *H01L 27/14634* (2013.01); *H04N 25/778* (2023.01)

(58) Field of Classification Search
CPC ...... H04N 5/379; H04N 25/53; H04N 25/531; H04N 25/75; H04N 25/771; H04N 25/778; H04N 25/79; H01L 27/14621; H01L 27/14625; H01L 27/14634; H01L 27/1464; H01L 27/14641
See application file for complete search history.

(56) References Cited

U.S. PATENT DOCUMENTS

| | | | | |
|---|---|---|---|---|
| 9,105,546 | B2* | 8/2015 | Velichko | H01L 27/14627 |
| 10,002,901 | B1 | 6/2018 | Xu et al. | |
| 2003/0052252 | A1* | 3/2003 | Sugiyama | H04N 5/335 348/E3.018 |
| 2010/0020209 | A1* | 1/2010 | Kim | H04N 9/04557 348/E5.022 |
| 2010/0309340 | A1 | 12/2010 | Border et al. | |
| 2011/0006240 | A1 | 1/2011 | Williams et al. | |
| 2011/0049665 | A1 | 3/2011 | Goto | |
| 2011/0228399 | A1 | 9/2011 | Ohnishi | |
| 2012/0175499 | A1 | 7/2012 | Meynants et al. | |
| 2014/0139713 | A1* | 5/2014 | Gomi | H04N 25/709 348/308 |
| 2014/0226047 | A1 | 8/2014 | Lahav et al. | |
| 2015/0296159 | A1 | 10/2015 | Mansoorian et al. | |
| 2015/0340391 | A1* | 11/2015 | Webster | H01L 27/14625 257/432 |
| 2015/0350583 | A1 | 12/2015 | Mauritzson et al. | |
| 2016/0112665 | A1 | 4/2016 | Meynants et al. | |
| 2016/0165214 | A1* | 6/2016 | Kim | H04N 13/254 348/49 |
| 2016/0227138 | A1 | 8/2016 | Kozlowski | |
| 2016/0358969 | A1 | 12/2016 | Fu et al. | |
| 2016/0360138 | A1 | 12/2016 | Meynants | |
| 2017/0006240 | A1 | 1/2017 | Sron | |
| 2017/0330909 | A1 | 11/2017 | Wan et al. | |
| 2018/0083057 | A1* | 3/2018 | Crocherie | H01L 27/14629 |
| 2018/0115752 | A1* | 4/2018 | Sato | H04N 9/04555 |
| 2018/0227516 | A1* | 8/2018 | Mo | H01L 27/14636 |
| 2018/0227521 | A1* | 8/2018 | Keung | H01L 27/14634 |
| 2018/0343402 | A1* | 11/2018 | Roth | H04N 5/2351 |
| 2019/0230339 | A1* | 7/2019 | Lu | H04N 13/214 |

FOREIGN PATENT DOCUMENTS

CN 108305885 A 7/2018
WO 2011033984 A1 3/2011

OTHER PUBLICATIONS

Koifman, "IEDM Image Sensor Presentations", Image Sensors World, Dec. 4, 2017, 3 pages.
Chinese Examination Report dated Apr. 28, 2023, issued in Chinese Patent Application No. 201980050794.3, with English translation, 15 pages.

* cited by examiner

PIXEL CELL AND METHOD FOR OPERATING A PIXEL CELL

CROSS REFERENCE TO RELATED APPLICATIONS

The present application is the national stage entry of International Patent Application No. PCT/EP2019/069266, filed on Jul. 17, 2019, published as WO 2020/025328 on Feb. 6, 2020, which claims the benefit of priority of European Patent Application No. 18187322.5, filed on Aug. 3, 2018, all of which are hereby incorporated by reference in their entirety for all purposes.

FIELD OF INVENTION

The present disclosure relates to a pixel cell for use in semiconductor image sensors and to a method for operating such a pixel cell in both a global and a rolling shutter mode of operation.

BACKGROUND

Figure 6:
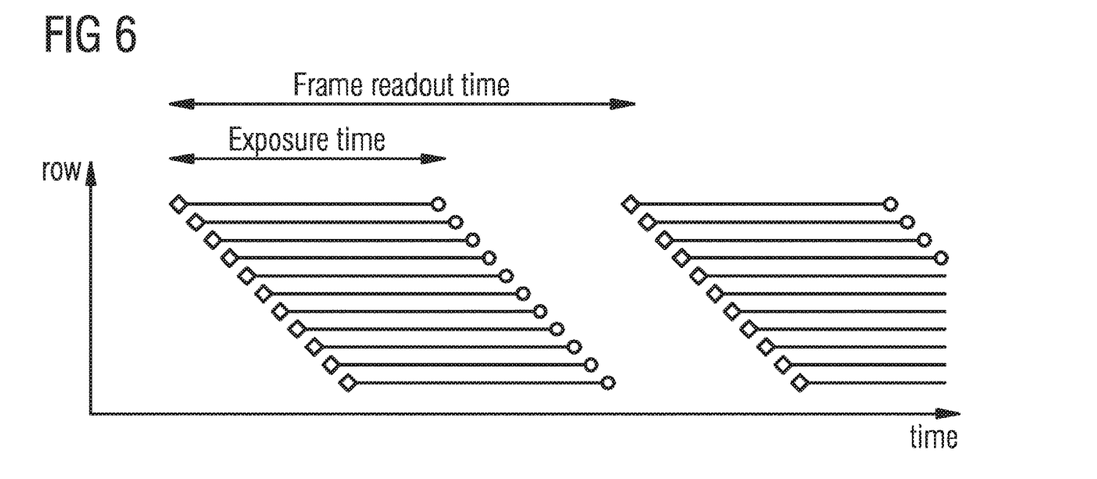
FIG. 6 shows an exemplary timing diagram of a pixel array in a rolling shutter mode of operation.

CMOS image sensors are used in a wide range of applications, such as for camera modules and smart phones, tablet computers, laptops, etc. In many of these applications, for high resolution visible band imaging the image sensor is operated in a so-called rolling shutter mode of operation. In this mode the pixels of a pixel matrix are sequentially read out and reset row-by-row, such that the readout process occurs in a repeating, rolling pattern. The exposure period is shifted in time for each row of the pixel array, as shown in FIG. 6.

Figure 7:
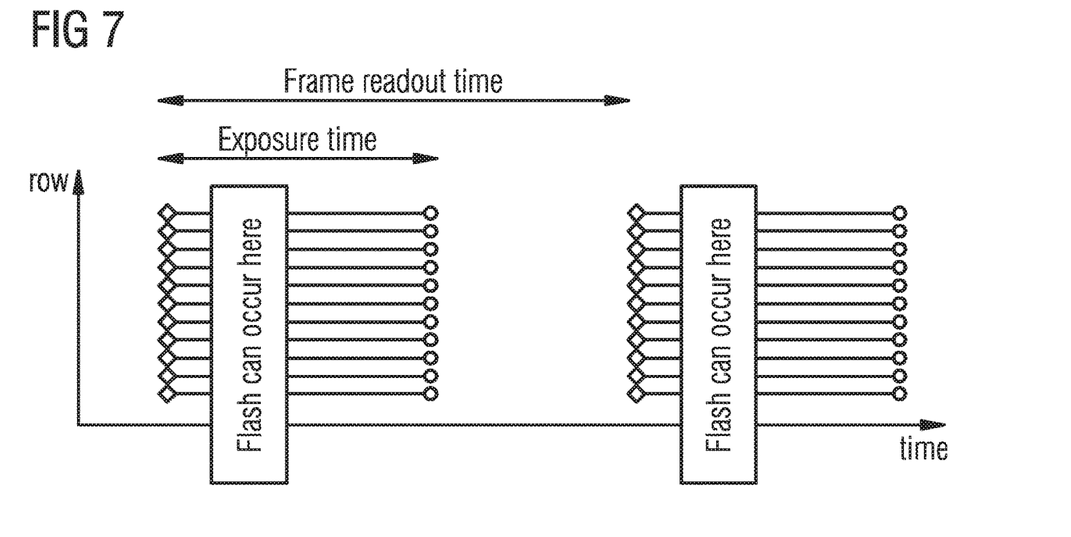
FIG. 7 shows an exemplary timing diagram of a pixel array in a global shutter mode of operation.

Other applications, however, demand a global shutter mode of operation, in which capturing of all the pixels of the image sensor, and hence the pixel cell, occurs during the same time period. Examples for such applications are infrared imaging processes with active illumination, for example three-dimensional imaging and identification, such as iris scanning and face recognition. In order to reduce power consumption, but also not to exceed critical light levels during the illumination, for example with respect to eye safety, short light pulses are required. In a global shutter mode, all pixels have to be exposed and thus integrate photocarriers during the illuminating light pulse, as shown in FIG. 7.

Because of different requirements for the two modes of operation, typical systems so far employ dedicated camera modules for visible band imaging and infrared imaging. Increasing space constraints and cost savings in modern electronic devices, however, necessitate a single image sensor capable of both the rolling and global shutter modes of operation.

Alternative approaches feature image sensors with dedicated color pixels and infrared pixels. These sensors have the disadvantage, however, that the captured images in both the visible and the infrared domain need to be interpolated for the missing information due to "blind" pixels for the respective band. In addition, dedicated pixels for infrared require a larger surface than those for the visible band due to the higher diffraction limit, such that a combined arrangement is difficult to achieve without sacrificing resolution.

This disclosure provides an improved concept for a pixel cell, which is capable of both rolling and global shutter operation and which overcomes at least one of the problems of existing pixel cells.

The improved concept is based on the idea of providing an image sensor with pixel cells, in which the individual pixels of the pixel cell are either read out individually according to a rolling shutter process, wherein the information of each pixel is maintained, or the pixels are read out simultaneously according to a global shutter process, wherein the information of the pixels during readout is combined.

In particular, an embodiment of a pixel cell according to the improved concept comprises a pixel set with a plurality of pixels, with each pixel of the pixel set comprising a photodiode and a transfer gate coupled to the photodiode. The pixel cell further comprises a readout circuit having a floating diffusion coupled to all of the transfer gates, a column output line, a sample-and-hold-stage coupled to the floating diffusion, a first switch coupling the sample-and-hold stage to the column output line and a second switch coupling the floating diffusion to the column output line or to a further column output line.

Each pixel of a pixel cell according to the improved concept is configured to capture optical information incident upon the respective pixel and to generate electrical information representative of the optical information. Especially for image sensors fabricated according to standard CMOS technologies, the working principle of the pixels is the conversion of optical intensity into a photocurrent using a photodiode. Silicon-based photodiodes are a common choice in this connection, as these diodes are sensitive over a broad wavelength range between 190 nm and 1100 nm and therefore cover the relevant part of the electromagnetic spectrum in both the visible and the infrared domain. In addition, due to the large bandgap of silicon, silicon-based photodiodes show a superior noise performance compared to other photodiodes, such as germanium-based photodiodes.

The readout circuit of a pixel cell according to the improved concept is configured to manage collection and output of the electrical information from each pixel of the pixel set and to operate the pixel set in two different modes of operation via the first switch to the sample-and-hold stage and via the second switch directly to a column output line of the pixel cell. For example the two modes of operation are a global shutter mode and a rolling shutter mode.

In at least one embodiment, the readout circuit is configured, in a global shutter mode of operation, to control the plurality of pixels such that corresponding charges generated by the photodiode of each of the plurality of pixels in response to incident radiation are simultaneously transferred to the floating diffusion in accordance with transfer control signals simultaneously transmitted to the transfer gates. Further, the readout circuit is configured to generate a global shutter output signal depending on the corresponding charges from the photodiode of each of the plurality of pixels, in particular depending on a sum or an average of said corresponding charges from the photodiode of each of the plurality of pixels, and to transfer the global shutter output signal to the column output line in accordance with a global shutter control signal transmitted to the first switch.

In such an embodiment, the readout circuit is further configured, in a rolling shutter mode of operation, to control the plurality of pixels such that corresponding charges generated by the photodiode of each of the plurality of pixels in response to incident radiation are sequentially transferred to the floating diffusion in accordance with transfer control signals sequentially transmitted to the transfer gates. Further, the readout circuit is configured to generate individual rolling shutter output signals, with each rolling shutter output signal depending on the corresponding charges from the photodiode of one of the plurality of pixels, and to transfer the individual rolling shutter output signal to the column output line or to the further column output line in accordance with a rolling shutter control signal transmitted to the second switch.

In the global shutter mode, the electrical information from each pixel is combined for generating a global shutter output signal, while in the rolling shutter mode, the electrical information from each pixel is used to generate individual rolling shutter output signals.

In particular, in a pixel cell according to the improved concept, no interpolation is necessary as in both modes of operation the signal from all pixels is evaluated.

In some embodiments, the pixel cell is operated, in particular exclusively operated, in the global shutter mode for charges generated by the photodiode of each of the plurality of pixels based on incident radiation in a first wavelength range, in particular a near-infrared range including 940 nm, and in the rolling shutter mode for charges generated by the photodiode of each of the plurality of pixels based on incident radiation in a second wavelength range, in particular a visible range.

In such a pixel cell, the rolling shutter mode of operation may be employed for imaging in the visible domain, for example. Image processing of the individual rolling shutter output signals of each pixel cell of an image sensor enables the reconstruction of a high resolution image, for example a photograph.

The global shutter mode, on the other hand, may be employed for situations in which short exposure times and/or fast image processing are required, for example in 3D imaging, in particular in the near-infrared domain, with short and high-intensity illumination of the object or objects to be captured. Although such a global shutter mode of operation entails a sacrifice in resolution as all pixels of a pixel cell are combined, this may be acceptable for a wide range of applications. For example, for facial recognition, a high-resolution 3D image may not be necessary as the reduced depth resolution may still suffice to enable identification of unique characteristic features of a user.

Another aspect of combining the signals from the individual pixels of the pixel cell in the global shutter mode is that the individual signals of the pixels may be too small to be processed. Particularly in the infrared domain, small signals of individual pixels may be a consequence of lower overall light intensity compared to that in the visible domain, for example. Moreover, the pixels themselves may be less sensitive in the infrared domain. Also, small pixel sizes in modern image sensors make the diffraction limit become a significant factor, especially for the larger wavelengths of infrared light.

For visible light on the other hand, a rolling shutter mode is typically employed as light intensities tend to be sufficiently high, such that each pixel signal is large enough. Also, the diffraction limit at visible wavelengths is generally not reached with pixel sizes of modern image sensors.

In some embodiments, at least the plurality of pixels and the floating diffusion are arranged on a first die and at least the column output line, the sample-and-hold stage and the first switch are arranged on a second die.

Arranging at least some components of the readout circuit on a second die, for example a die that is bonded to the first die using standard wafer bonding techniques, enables a dense arrangement of the pixels of the pixel cell without sacrificing space for readout electronics in between pixels or pixel cells. In particular, the first die may provide electrical connections to the pixels via contact pads on a surface of the first die that faces away from a light entrance surface of the pixel cell. During bonding these contact pads are aligned and therefore electrically connected to further contact pads arranged on a surface of the second die comprising the readout electronics.

In some embodiments, for the capturing of optical information the pixels are backside illuminated.

For efficient photon capturing, pixels of a pixel cell should be designed in a manner, in which light-capturing regions of the pixels, for example a p-n junction of a photodiode, are not obstructed by any other components. To prevent electrical connections from forming an obstacle for incident light before entering the light-capturing region, an approach during fabrication according to standard CMOS techniques is to form the light-capturing region on a top side of the wafer substrate followed by a layer containing the electrical connections. In a subsequent step, the wafer substrate is thinned on its backside, for instance by means of a grinding step, such that incident light reaches the thinned substrate through the backside close to the light-capturing region. Typical substrate thicknesses of a backside illuminated pixel are in the order of 3 to 10 µm. It has been proven that the described backside illumination technique enhances the probability of an input photon being captured from about 60% to over 90% for visible light.

In some embodiments, the sample-and-hold stage comprises a first storage stage and a second storage stage, wherein the first storage stage and the second storage stage are arranged in series or in parallel and each comprise a switch and a capacitor.

Providing a sample-and-hold stage with multiple storage stages allows for storing different signals during a readout process of the pixel cell. For example, a reset level of the floating diffusion is stored in the capacitor of the first storage stage before or during an exposure, and a signal level is stored in the second storage stage after the exposure and transfer of charges from the photodiodes to the floating diffusion. Storing two signals enables further signal processing to achieve a larger signal-to-noise ratio, for instance via subtraction of the reset level from the signal level.

As disclosed in U.S. Pat. No. 8,754,357 B2, arranging the first and the second sample stage in series, i.e. in a cascade, may be advantageous over a parallel arrangement in view of fewer components needed and reduced susceptibility to a parasitic capacitance at the floating diffusion, for example, if the storage capacitors are limited in terms of their capacitance.

In some embodiments, the pixel cell further comprises the further column output line, wherein the further column output line is configured as a rolling shutter column output line and the column line is configured as a global shutter column output line.

For a pixel cell capable of operating in two different modes, such as a global shutter mode and a rolling shutter mode, it may be required to direct the generated output signals to a dedicated processing unit depending on the mode of operation. To this end, the pixel cell may comprise a further column output line, wherein the two output column lines connect the pixel cell to one of two processing units configured for processing the global shutter output signal and the rolling shutter output signals, respectively.

In some embodiments, each pixel of the pixel set is sensitive to infrared light, in particular near-infrared light including a wavelength of 940 nm, and to at least part of the visible spectrum.

An image sensor, in which the pixels are sensitive to both visible and infrared light, provides the capability of capturing images in the visible domain, i.e. photographs, and in the infrared domain, in which the imaging serves the purpose of performing three-dimensional information capture, such as for facial recognition applications, for instance. Such an image sensor hence eliminates the necessity of providing two dedicated image sensors for the above-mentioned purposes.

In some embodiments, the pixels of the pixel set are separated by trenches, in particular by trenches filled with a trench material with a small refractive index compared to a material of the pixels. Furthermore, each pixel of the pixel set in these embodiments further comprises light diffraction structures, LDS.

In order to enhance the sensitivity of each pixel, in particular in the infrared domain, the pixels may be separated from each other by trenches that ideally extend from the top surface of the pixel, i.e. the light entering surface, to the substrate of the pixel. These deep trenches then enable total internal reflection of light incident above a critical angle and therefore serve the purpose of confining the light within the pixel material and hence providing efficient guidance of the light to the light-capturing region of the respective pixel.

Further sensitivity enhancement, in particular in the near-infrared domain without significantly, if at all, influencing other wavelength ranges, is achieved by providing light diffraction structures at the entrance surface into the respective pixel. In combination with total internal reflection at the pixel sidewalls due to the trenches, these structures have the purpose to scatter incident light to then increase the effective optical path within the pixel and therefore increase the absorption efficiency.

In some embodiments, the pixel cell further comprises a color filter arrangement of filters, wherein each filter acts as a bandpass filter for a distinct wavelength range, in particular a wavelength range of red, green or blue light, such that each of, or a majority of pixels of the pixel set comprises a distinct color filter. Furthermore, the filters in these embodiments act as bandpass filters for a further wavelength range, in particular a further wavelength range of infrared light, in particular a further wavelength range that includes 940 nm.

Providing the pixel of the pixel set with distinct filters allows for the capturing of light information in different wavelength domains. For imaging in the visible domain, a common example is the employment of red, green and blue (RGB) filters. Having at least one pixel of the pixel set dedicated to each color in combination with a sequential readout, i.e. a rolling shutter mode of operation, allows for the reconstruction of the captured image based on light information of a red, a green and a blue channel for the example of RGB filters, for instance.

A typical filter arrangement in present image sensors is the so-called Bayer color filter arrangement, CFA. In such an image sensor, two pixels of the pixel cell are equipped with a green color filter, while a third pixel has a red and a fourth pixel has a blue color filter. As the human eye has a non-uniform sensitivity across the visible range and is most sensitive for green light, the capturing of two green channels in addition to a red and a blue channel enables for higher contrast and sharpness of the reconstructed image.

For a global shutter mode of operation, it is advantageous if all pixels of the pixel set are equally sensitive at the wavelengths of the incident light. For example, if the global shutter mode is used to capture information from incident infrared light, the color filters are required to be transmissive at this respective wavelength range. For example in case of RGB filters, the individual filters therefore may be further configured to also transmit at the further wavelength range that includes 940 nm, as typical infrared light sources emit light at or around this wavelength.

Regular RGB color filters are typically transmissive at optical wavelengths larger than 800 nm with comparable transmission levels for blue, green and red filters. In order for the pixels being susceptible to only the relevant portion of the infrared domain, filters employed in the described embodiments may, in addition to their transmission window in the visible domain, be configured to act as a bandpass filter around the infrared wavelength range of interest, for instance a bandpass around 940 nm with lower cutoff wavelength at 930 nm and upper cutoff wavelength of 950 nm.

In some embodiments, the pixel set comprises three pixels or four pixels, in particular four pixels arranged in a 2×2 matrix.

For imaging in the visible domain, a pixel cell comprising three or four pixels is a standard choice for efficient reconstruction of an image using three or four color channels. In the global shutter mode, in which all pixels of a pixel cell are combined, a reduction of the resolution by a factor of three or four according to the number of pixels, proves to be sufficient for many applications, such as 3D image capturing applications.

The arrangement in a 2×2 matrix allows for an efficient configuration with minimum space requirement.

In some embodiments, each of the plurality of pixels is equal in size and has a footprint smaller than 2 µm×2 µm, in particular a footprint equal to or smaller than 1.4 µm×1.4 µm.

In order to support high resolution imaging, the size of the pixel cell and hence the size of the pixels are required to be as small as possible. Owing to modern fabrication techniques, the size of pixels for imaging in the visible domain has been decreased to a square format with side length around 1.4 µm or smaller. For example, image sensors with pixel sizes down to 0.9 µm are commercially available. Due to the lower diffraction limit, pixels sensitive to infrared light, however, need larger pixel sizes of at least 2 µm side length in order to maintain high efficiency at 940 nm, for instance. However, a pixel cell according to the improved concept allows for small pixels that taken together form a large enough surface to still efficiently detect infrared light.

In some embodiments, a capacitance of a sense node of the pixel cell is adjustable, in particular adjustable by means of a switch.

Extending a sense node of the pixel cell by means of an adjustable capacitance enables the adjustment of the conversion gain of the pixel cell. Depending on the mode of operation, different charges, or voltages, may be present at the sense node. In the global shutter mode of operation, in which all pixels are readout simultaneously, the total charge at the sense node may be four times as large compared to the rolling shutter mode of operation, in which the pixels are read out sequentially. An adjustable conversion gain therefore is desirable in order to provide similar signal levels in both operation modes. In addition, an adjustable conversion gain may also be beneficial for the global shutter mode in case of small signals from the pixels due to low light levels, for instance.

The adjustable capacitance may be realized by a capacitor connected to the sense node via a switch, for example.

In some embodiments, the readout circuit comprises a control unit that is configured to control the collection of the electrical information. In particular, in the global shutter mode the control unit acquires the electrical information from each pixel of the pixel set, generates the global shutter output signal as a combination, in particular as a sum or an average, of the electrical information from each pixel, and provides the global shutter output signal to an evaluation unit. In the rolling shutter mode the control unit acquires the electrical information from each pixel of the pixel set and provides the electrical information from each pixel to the evaluation unit as the individual rolling shutter output signals.

The object is further solved by an image sensor comprising a plurality of pixel cells according to one of the aforementioned embodiments, in particular by a CMOS image sensor.

An image sensor with pixel cells according to the improved concept enables a flexible capturing process depending on wavelength range and/or intensity of the incident light.

In some embodiments, the image sensor is configured to image an object or a scene and is operated in combination with a light source, wherein the light source either illuminates the object or the scene, or projects a pattern onto the object or the scene.

Due to otherwise low light levels, particularly for imaging in the infrared domain active illumination, for example by means of a flash, is required. The flash may occur at the beginning of or within the exposure period.

For example, the image sensor may be a component of an imaging system that also comprises a light source configured to operate in combination with the image sensor, such as a flash. In such an imaging system, depending on the mode of operation a dedicated light source may be operated in combination with the image sensor.

In some embodiments, the image sensor is configured to operate in a global shutter mode of operation for three dimensional imaging of an object or a scene.

For instance, a rolling shutter mode of operation may be used for imaging, i.e. capturing light, in the visible domain and therefore be operated in combination with the light source for illuminating the object or the scene. The global shutter mode on the other hand may be dedicated to imaging in the infrared domain, wherein an infrared light source is employed that illuminates the object or the scene or projects a pattern onto it.

The active illumination may be provided by means of a light source, such as a light-emitting diode, LED, or a vertical-cavity surface-emitting laser, VCSEL. The illumination may be configured to project a pattern, for example a grid of light spots, onto the object or the scene, which is to be captured, especially for 3D imaging applications.

The object is further solved by an electronic device with an imaging system, such as a camera system, comprising an image sensor with pixel cells according to one of the aforementioned embodiments.

Conventional electronic devices employ two separate camera modules for visible imaging, such as a front camera in a mobile device, and infrared imaging for identification purposes, such as facial or iris recognition. Using however a single camera module with an image sensor according to the improved concept, enables an image sensor for imaging in the visible domain to also be capable of imaging in the infrared domain. Hence, the necessity of an additional camera module dedicated to infrared imaging is eliminated and space can be saved. This is particularly of relevance for small electronic devices with severe space limitations for further components. Prominent examples are smartphones, tablet computers, portable computers and the like, but also larger devices, such as personal computers and/or their displays, may benefit from a smaller amount of components. The use of a single component also solves the needs for alignment calibration between both cameras.

The object is further solved by a method for operating a pixel cell comprising a pixel set with a plurality of pixels, with each pixel of the pixel set being configured to capture optical information incident upon the respective pixel and generate electrical information representative of the optical information. The method according to the improved concept comprises collecting and outputting the electrical information from each pixel of the pixel set and operating the pixel set in a global shutter mode and in a rolling shutter mode of operation. In the global shutter mode of operation, the electrical information from each pixel of the pixel set is combined, in particular as a sum or average, for generating a global shutter output signal. In the rolling shutter mode of operation, the electrical information from each pixel of the pixel set is used to generate individual rolling shutter output signal.

Further embodiments of the method become apparent to the skilled reader from the embodiments of the pixel cell described above.

BRIEF DESCRIPTION OF THE DRAWINGS

The following description of figures of exemplary embodiments may further illustrate and explain aspects of the improved concept. Components and parts of the pixel cell with the same structure and the same effect, respectively, appear with equivalent reference symbols. In so far as components and parts of the pixel cell correspond to one another in terms of their function in different figures, the description thereof is not repeated for each of the following figures.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the disclosure described herein are capable of operation in other sequences than described or illustrated herein.

Figure 1:
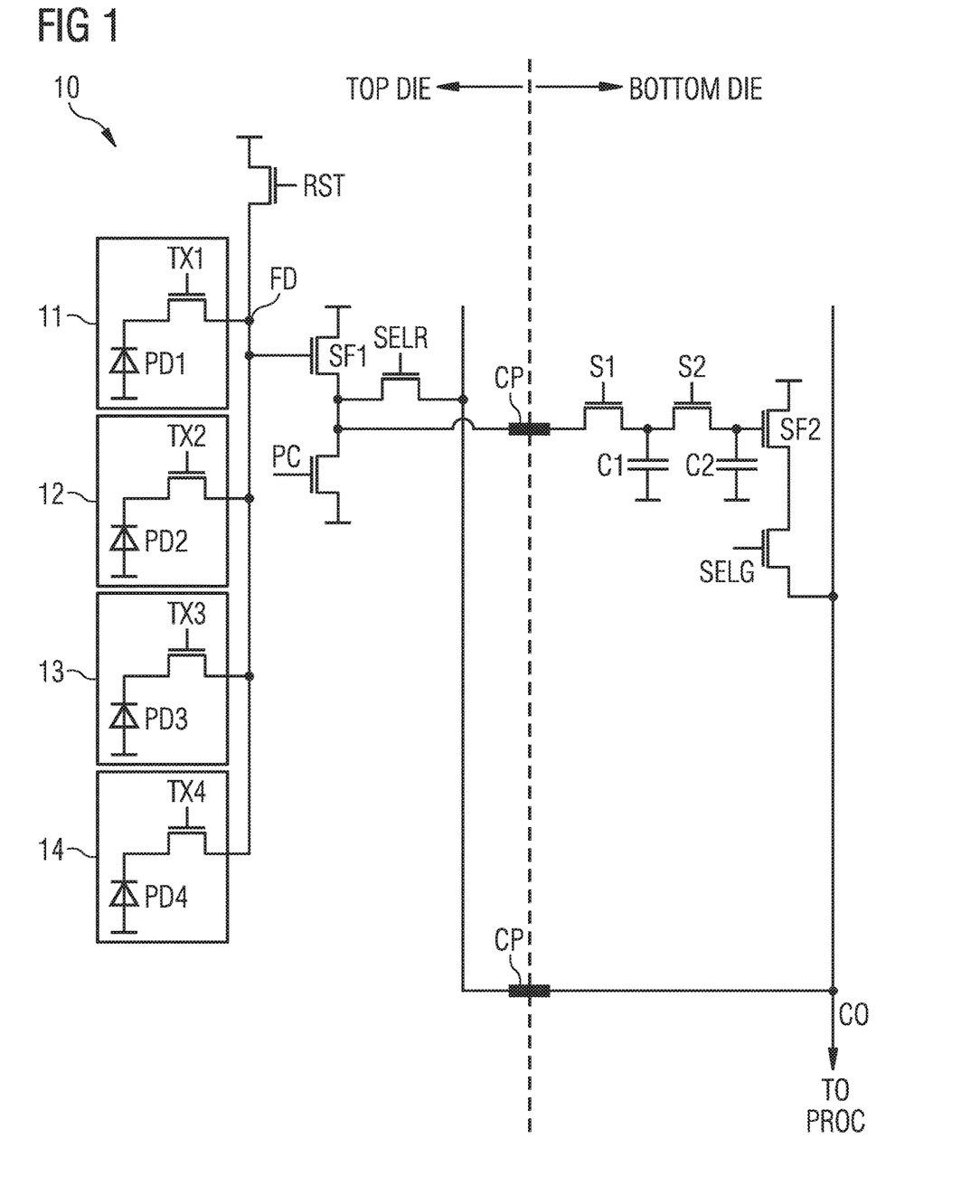
FIG. 1 schematically shows an embodiment of a pixel cell according to the improved concept.

FIG. 1 shows an embodiment of a pixel cell 10 according to the proposed concept. The scheme is based on an embodiment disclosed in U.S. Pat. No. 8,754,357 B2 that features a pixel array and a global shutter mode of operation for the pixel array. In particular, FIG. 1 shows a pixel cell 10 comprising a pixel set on a top die having a plurality of pixels 11-14 that are typically arranged in rows and columns, for example in a 2×2 configuration in case of four photodiodes PD1-PD4. Each of the pixels 11-14 comprise a photodiode PD1-PD4 which is responsive to electromagnetic radiation, typically light in the visible and/or in the infrared band. The photodiodes PD1-Pd4 may for example be pinned photodiodes.

Also arranged on the top die, transfer gates TX1-TX4 connect the cathode of each photodiode PD1-PD4 to a common sense node represented by a floating diffusion FD. The floating diffusion FD is typically defined by the junction capacitance formed by the transfer gates TX1-TX4 and reset transistor areas. In some embodiments, an additional dedicated floating diffusion capacitor may be located at the sense node. The transfer gates TX1-TX4 are responsive to transfer control signals and may be either opened and/or closed simultaneously or individually depending on the transfer control signals. When a transfer gate TX1-TX4 is opened it is able to transfer substantially all charge from the respective photodiode PD1-PD4 to the floating diffusion FD. A reset transistor switch RST is responsive to a reset control signal and is operable to initialize the floating diffusion FD to a predefined voltage. This initialization is typically done before the charge transfer.

A first source follower SF1 on the top die, also known as a common-drain amplifier, buffers the voltage of the floating diffusion FD at an input of the first source follower SF1 to an output of the amplifier. A precharge transistor PC is configured as a load transistor and acts as a current source for the first source follower SF1. This precharge transistor may be arranged on the top or on the bottom die.

For a global shutter mode of operation, a scheme as disclosed in an embodiment of U.S. Pat. No. 8,754,357 B2 is employed. In particular, two cascaded sample stages are arranged on a bottom die, each comprising a switch transistor S1, S2 and a capacitor C1, C2. The cascaded sample stages are connected to the output of the first source follower SF1 on the top die via aligned contact pads CP on the top die and the bottom die. At the output of the cascaded sample stages, a second source follower SF2 is connected and acts as a second buffer amplifier, analogous to the first source follower SF1. At the output of the second source follower SF2, a global shutter readout transistor SELG is connected and acts as a switch to, when activated via a global shutter control signal, connect the buffered voltage from the output of the second source follower SF2 to a column output line CO for further signal processing.

In the global shutter mode, the pixel cell 10 is operated as follows:
1. At the start of an exposure time, the photodiodes PD1-PD4 are empty and do not contain any photocharges.
2. The image is acquired during an exposure time. Radiation incident on the photodiodes PD1-PD4 generates photocharges which are collected inside the photodiodes PD1-PD4.
3. (At least) at the end of the exposure time, the floating diffusion FD is reset by pulsing the reset transistor RST with the reset control signal. The FD can be held in the reset state at all times except when transferring charge to the floating diffusion (step 4) and when sampling the signal (step 5).
4. The buffered reset level of the floating diffusion FD is sampled on the capacitor C2 by pulsing, i.e. temporarily closing, the switch transistors S1, S2.
5. Charge is transferred through the transfer gates TX1-TX4 by pulsing the transfer gates TX1-TX4 with the transfer control signals. The transfer gates TX1-TX4 are opened simultaneously and with the same timing in the global shutter mode. The combined charge Q from the photodiodes PD1-PD4 generates a voltage signal on the floating diffusion FD depending on the capacitance CFD of the floating diffusion FD. In particular, the signal is equal to Q/CFD.
6. The voltage signal is buffered by the first source follower SF1 and sampled on the capacitor C1 by pulsing the switch transistor S1. This ends the exposure time.
7. After the charge transfer, the photodiodes PD1-PD4 are depleted. They do not contain any remaining charge. Optionally, an additional reset can be generated to ensure that all charge is evacuated from the photodiodes PD1-PD4. This reset is achieved by pulsing the reset transistor RST and the transfer gates TX1-TX4 together.
8. When the transfer gates TX1-TX4 open again, the next exposure time can start. This may happen immediately after this image capture sequence or later.
9. The image is read out by reading the values stored in the capacitors C1, C2, buffering the voltages using the second source follower SF2, and outputting them to the column output line CO through the global shutter readout transistor SELG, for example by means of an applied global shutter control signal. A processing unit PROC calculates the difference between the two values to cancel any kTC noise on the floating diffusion FD and hence achieves a true correlated double sampling readout. During this readout, the photodiodes PD1-PD4 may be exposed to radiation for acquisition of a next frame.

In particular in the global shutter mode of operation, the precharge transistor PC may be used to discharge capacitor C1 before sampling of the voltage signal (step 6). Alternatively or in addition, the precharge transistor PC may be used to discharge capacitor C2 before the reset level is sampled on C2. The precharge transistor may be arranged on the top die or on the bottom die, depending on a desired layout.

As in step 5 the charge of all pixels 11-14 of the pixel set are combined, the resolution of the captured image is reduced by a factor corresponding to a number of pixels 11-14 of the pixel set, for example by a factor of 4.

In an alternative mode of operation, only a partial number of transfer gates is pulsed in step 5, such as transfer gates from one or two pixels. This mode of operation may allow to capture an image of a specific color band, e.g. only the signals from pixels comprising a green transmission filter, in a sub-sampled image.

In a rolling shutter mode of operation, a rolling shutter readout transistor SELR acts as a switch for transferring the buffered voltage from the output of the first source follower SF1 to the processing unit PROC via the column output line CO for further processing.

In the rolling shutter mode, the pixels 11-14 of the pixel set are exposed and read out sequentially, e.g. row-by-row. In particular, the pixel 11 of the pixel cell 10 is operated as follows:

1. At the start of a first exposure time, the photodiode PD1 is empty and does not contain any photocharges.
2. The image is acquired during the first exposure time. Radiation incident on the photodiode PD1 generates photocharges which are collected inside the photodiode PD1.
3. (At least) at the end of the first exposure time, the floating diffusion FD is reset by pulsing the reset transistor RST with the reset control signal. The floating diffusion FD can be held in the reset state at all times except when transferring charge to the floating diffusion (step 4) and when sampling the signal (step 5).
4. The buffered reset level of the floating diffusion FD is output to the column output line CO by pulsing the rolling shutter readout transistor SELR.
5. Charge is transferred through the transfer gate TX1 by pulsing the transfer gate TX1 with the transfer control signal. The charge Q from the photodiode PD1 generates a voltage signal on the floating diffusion FD depending on the capacitance CFD of the floating diffusion FD. In particular, the signal is equal to Q/CFD.
6. The voltage signal is buffered by the first source follower SF1 and output to the column output line CO by pulsing the rolling shutter readout transistor SELR. This ends the exposure time.
7. After the charge transfer, the photodiode PD1 is depleted. It does not contain any remaining charge. Optionally, an additional reset can be generated to ensure that all charge is evacuated from the photodiode PD1. This reset is achieved by pulsing the reset transistor RST and the transfer gate TX1 together.
8. When the transfer gate TX1 opens again, the next exposure time for this pixel can start. This may happen immediately after this image capture sequence or later.
9. The sequence is repeated accordingly for the photodiodes PD2, PD3 and PD4.

As the pixels 11-14 are read out sequentially, after the described procedure the remaining pixels of the pixel set are read out one by one following the same scheme. For example pixel 11 is read out first, followed by pixel 12, followed by pixel 13, followed by pixel 14 of the pixel cell 10 described above. The exposure times of the pixels 11-14 in the rolling shutter mode are optionally equal in length but not fully simultaneous. Typically, the exposure times overlap, with the overlap depending on the readout times.

The global shutter mode and the rolling shutter mode may be used for different bands of the electromagnetic radiation. For example, the rolling shutter mode may be used for capturing visible light and the global shutter mode may be used to capture infrared light, in particular near-infrared light.

The pixels 11-14 may be configured for different visible bands, such as red, green and blue. The sum of all pixels 11-14, which is read out in a global shutter mode of operation, produces a panchromatic or monochrome image. Since the color filters R, G, B are optionally transmissive for near-infrared light and the photodiodes PD1-PD4 are sensitive to near-infrared light, this summed signal will typically include information from the infrared portion of the incident light. In case of active illumination via an infrared light-source, for example, the global shutter output signal may be dominated by said infrared portion of the incident light. Moreover, if the infrared light includes a pattern, like it is for example used in structured light 3D pattern information, said pattern may be captured in the global shutter mode in the described way.

Figure 2:
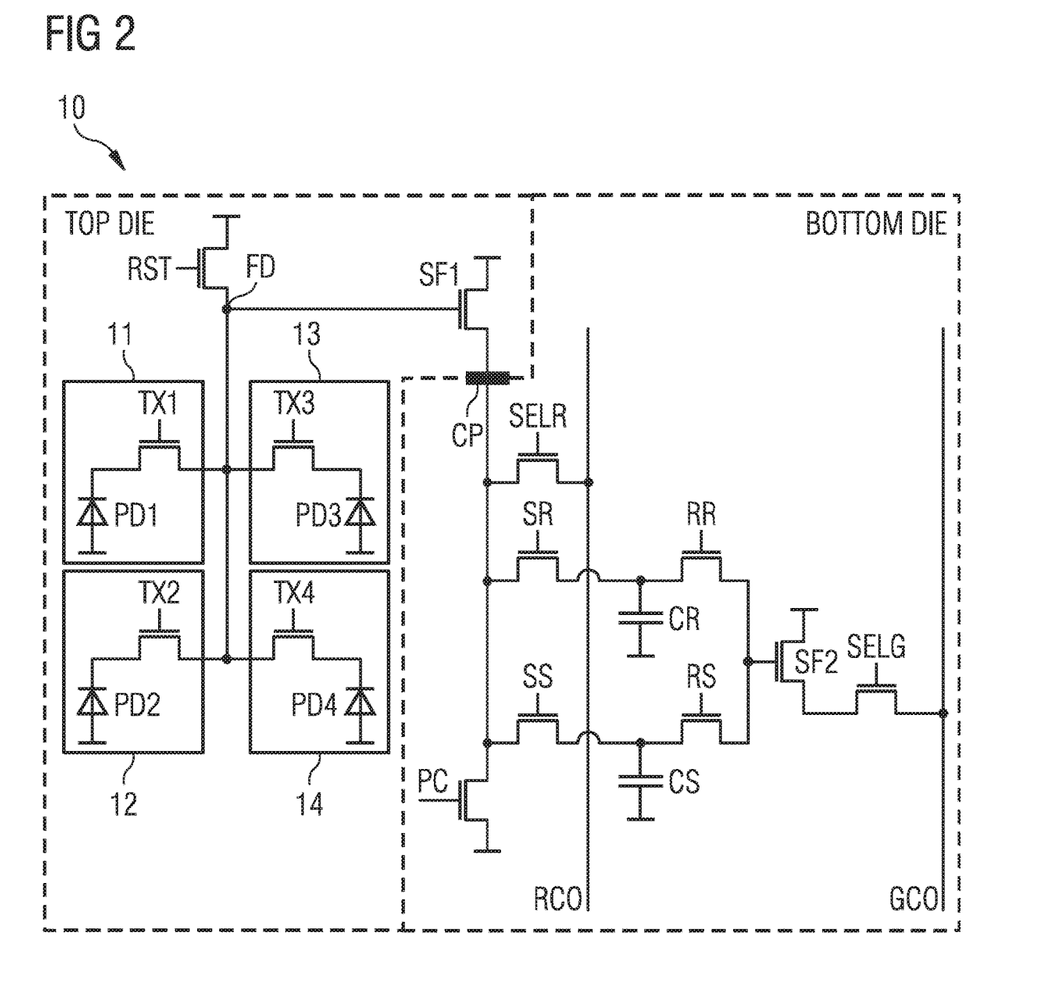
FIG. 2 schematically shows a further embodiment of a pixel cell according to the improved concept.

FIG. 2 shows a further embodiment of a pixel cell 10 according to the proposed concept. The working principle of this embodiment corresponds to that shown in FIG. 1.

In contrast to the embodiment shown in FIG. 1, the precharge transistor PC is arranged on the bottom die in this embodiment. Arranging as few components as possible on the top die saves space and hence enables a more dense arrangement of the pixels 11-14 of pixel cell 10.

In this embodiment, in the rolling shutter mode and in the global shutter mode, two distinct column output lines are used. For example, in the global shutter mode a first processing unit may be configured to process the global shutter output signal output by the pixel cell 10 via the global shutter column output line GCO, while in the rolling shutter mode, the individual rolling shutter output signals may be analyzed by means of a second processing unit connected to the rolling shutter column output line RCO.

A further difference in this embodiment is the parallel arrangement of the two sample stages, in contrast to the cascaded arrangement shown in FIG. 1. In this arrangement, the first sample stage comprises a reset level transistor SR, a reset capacitor CR and a read reset transistor RR and is configured to sample the reset level of the floating diffusion in accordance with step 4 of the global shutter procedure described for FIG. 1. The second sample stage comprises a signal level transistor SS, a signal capacitor CS and a read signal transistor RS and is configured to sample the signal level of the floating diffusion after charge transfer in accordance with step 6 of the global shutter procedure described for FIG. 1.

Figure 3:
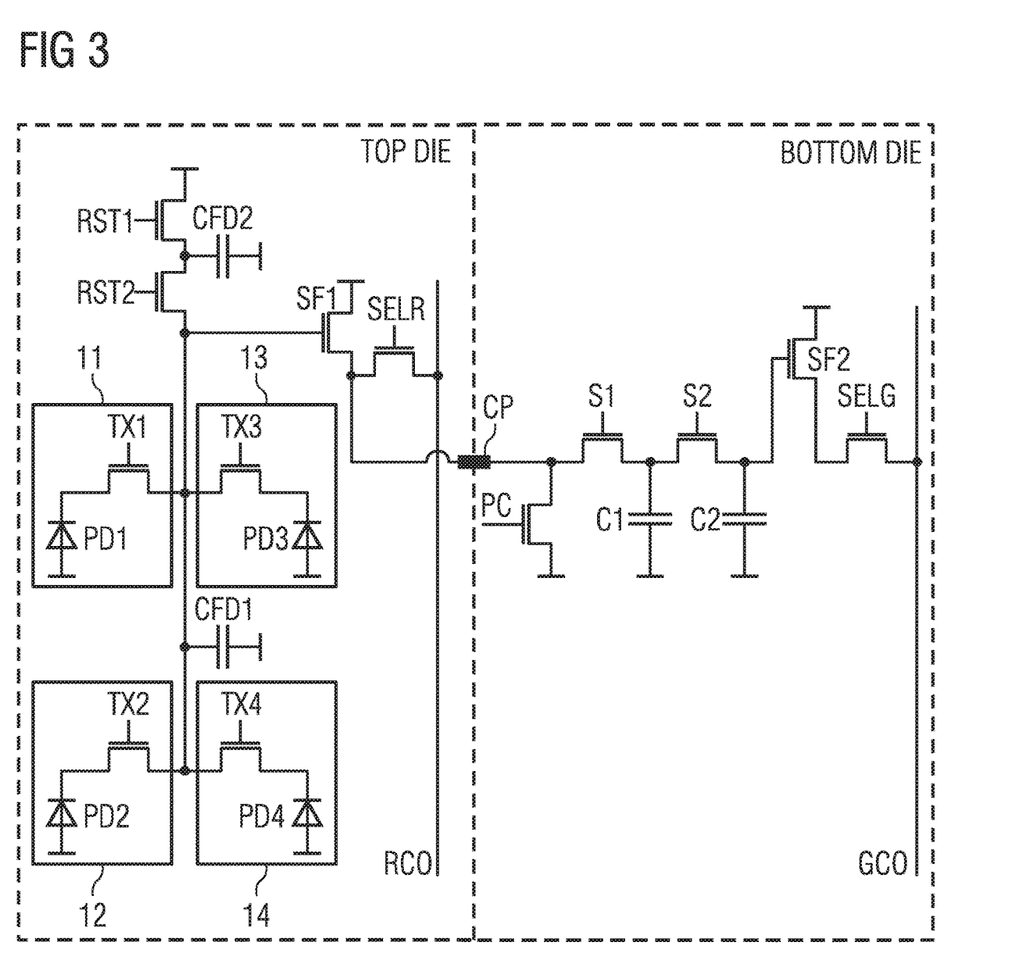
FIG. 3 schematically shows a further embodiment of a pixel cell according to the improved concept.

In a further embodiment shown in FIG. 3, a switchable capacitance may be located at the floating diffusion. This switchable capacitance may be used to adjust the conversion gain of the pixels. In the global shutter mode, in which the signal of the four pixels 11-14 is transferred simultaneously to the sense node, the floating diffusion will receive four times the charge compared to a single pixel readout, or rolling shutter, mode. However, the signal swing on the pixel is limited, typically to 1V or 1.5V. Hence, it is beneficial to use a larger capacitor at the floating diffusion FD.

In this embodiment, this is realized by two reset switches RST1, RST2 arranged in series and two floating diffusion capacitors CFD1, CFD2, as disclosed in US 2016/0112665 A1. In one mode, for example in the global shutter mode, the reset switch RST1 is used as reset switch and the reset switch RST2 is permanently conductive. The floating diffusion capacitance in this case is given as CFD1+CFD2 and the floating diffusion FD thus is able to handle the total charge of all four pixels of the exemplary pixel cell. In a second mode, the reset switch RST1 is permanently active and the reset switch RST2 is used to reset the floating diffusion FD. In this operating mode, only the floating diffusion capacitor CFD1 is used and therefore provides a high conversion gain for the pixel cell. This high gain mode is optionally used for single pixel readout, such as in a rolling shutter mode of operation, or in case when there is little light and a low noise readout is required also for the readout of all four pixels. In an optimum configuration, the floating diffusion capacitances are chosen to fulfill the expression CFD2+CFD1=4*CFD1. The floating diffusion capacitor CFD1 may be minimized to parasitic capacitances only. The floating diffusion capacitor CFD2 may be composed partially of an extra dedicated capacitor, either a metal-metal capacitor, a MOS gate capacitor or any other known capacitor structure available in a mixed signal CMOS process.

In a further embodiment not shown, all components of the pixel cell 10 may be arranged in a non-stacked manner, i.e. on a single die. Such an arrangement may be advantageous for applications that employ image sensors that do not require a dense arrangement of pixels and/or pixel cells.

Figure 4:
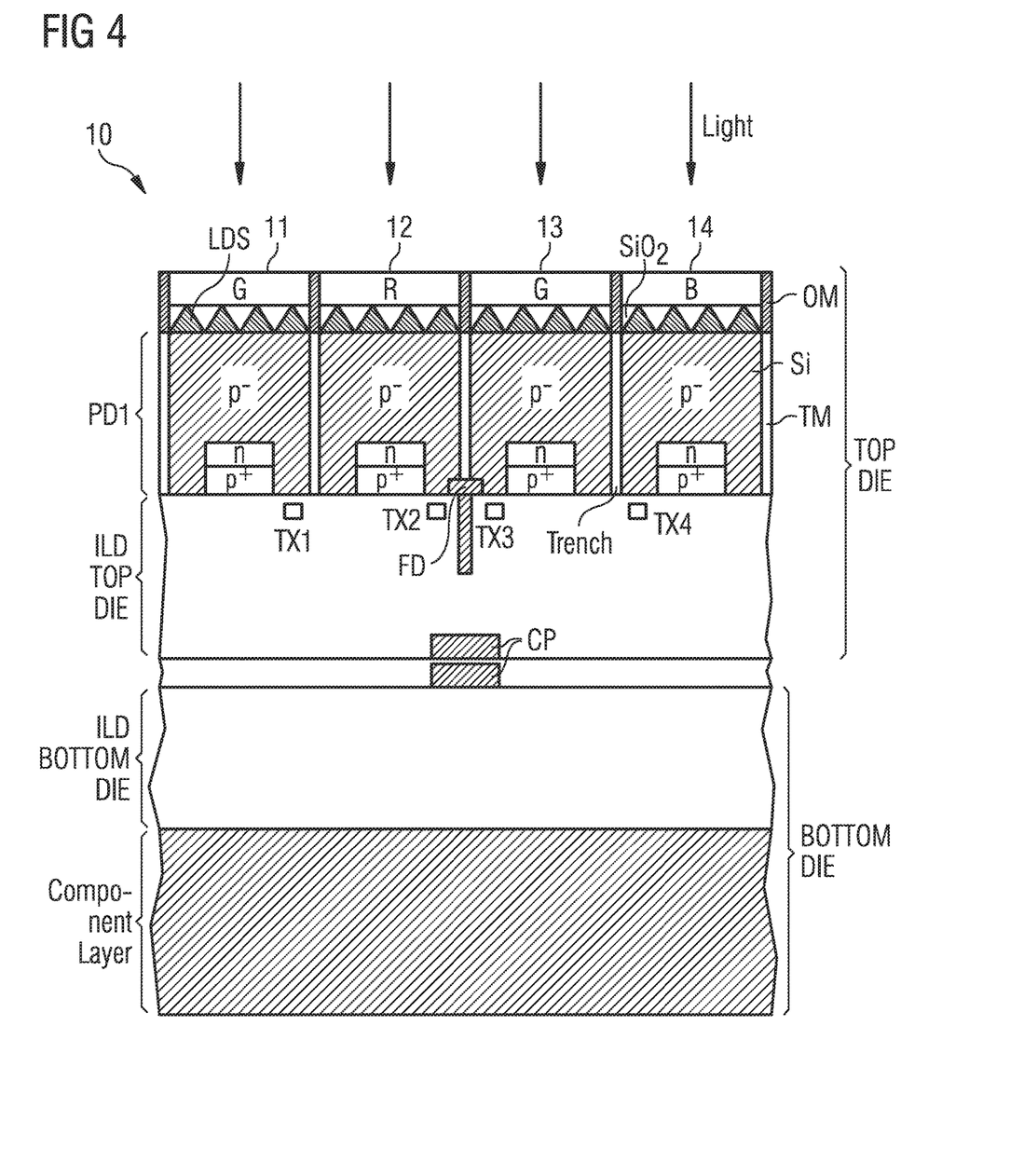
FIG. 4 shows further details of the physical structure of an embodiment of a pixel cell according to the improved concept.

FIG. 4 shows further details of the physical structure of an embodiment of a pixel cell 10 according to the improved concept. The drawing depicts a cross-section of a pixel cell 10 comprising four pixels 11-14 arranged in a row.

Each of the pixels 11-14 in this embodiment comprises a silicon-based photodiode 11-14 being characterized by a depletion region defined by a p+−n junction at the bottom of a thick layer of an absorption material, which in this example is lightly p-doped silicon (Si).

Each pixel 11-14 further comprises a transfer gate TX1-TX4 as described in the previous embodiments. The transfer gates TX1-TX4 together with the floating diffusion FD are arranged within an inter-layer dielectric (ILD) of the top die. On the bottom surface of the top die, a contact pad CP is arranged for connecting the floating diffusion FD to readout components on the bottom die. For illustration purposes, the reset transistor RST and the first source follower SF1, which may be arranged on the top dye are not shown.

The pixels 11-14 are separated by trenches that are filled with a trench material with a lower refractive index than that of silicon. For example, the trench material is silicon dioxide (SiO2). In addition, in this embodiment, light diffraction structures LDS are arranged at the light entrance surface of the pixels 11-14. For example, the light diffraction structures are formed by pyramidal structures made of silicon.

Together with the SiO2 filled trenches, the light diffraction structures LDS serve the purpose to increase the sensitivity of the photodiodes PD1-PD4 for light that does not enter the pixel at a perpendicular angle. Non-perpendicular incident light is diffracted at the surface of the light diffraction structures LDS and experiences within the absorption layer total internal refraction if impinging upon the boundary between absorption layer and trench above a critical angle. The trenches and the light diffraction structures LDS may hence significantly increase the overall sensitivity of each pixel 11-14, in particular for light in the infrared band, in particular in the near-infrared band including 940 nm.

The pixels 11-14 of the pixel cell 10 in this embodiment further comprise color filters R, G, B to achieve sensitivity of the pixels 11-14 only for certain wavelength bands. For example, the color filter arrangement may be a Bayer filter arrangement consisting of two green filters G, a red filter R and a blue filter B as illustrated. In this arrangement two pixels 11,13 are configured to detect green portion of the spectrum of the incident light, while one pixel 14 is configured to detect the blue portion and one pixel 12 is configured to detect the red portion. In addition, the color filters R, G, B may be transmissive for infrared light, in particular for the near-infrared band including 940 nm.

To prevent a cross talk between the pixels caused by photons that pass through a filter of one pixel and are captured by the light-capturing region of another pixel, an opaque material OM is arranged on top of the trench material TM.

The bottom die in this embodiment likewise comprises an inter-layer dielectric, in which wiring may be arranged. On a top surface of the bottom die, a contact pad CP is arranged for connecting the readout components arranged in a component layer to the floating diffusion FD or to the output of the first source follower SF1 comprised within the ILD of the top die.

The capacitors in the bottom layer (C1 and C2 in FIG. 1 and CR and CS in FIG. 2) may be constructed by MOS gates, by metal-metal fringe capacitors, by metal-isolator-metal plates, by 3D-trench capacitors in the metal back-end, or by trench capacitors in the silicon (front-end), as commonly known in the art.

Figure 5:
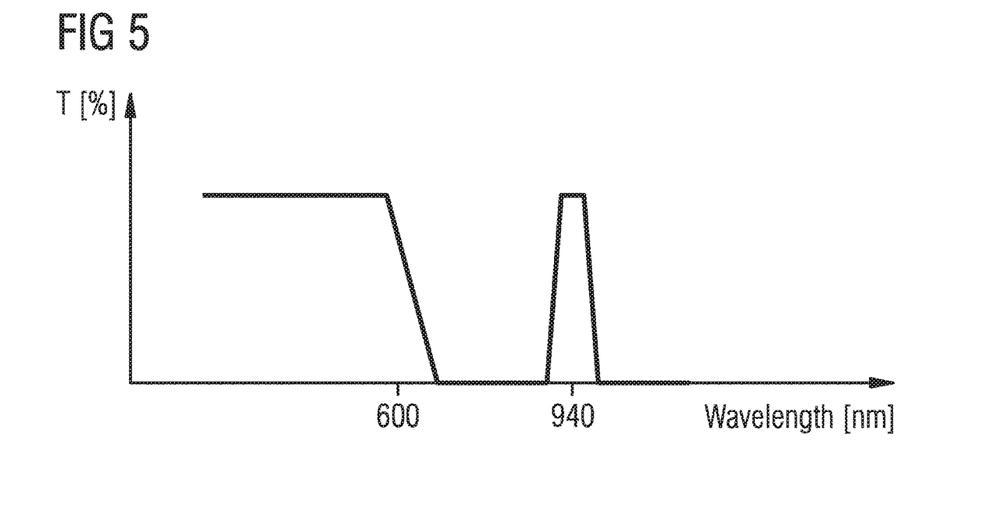
FIG. 5 shows transmission characteristics of an exemplary optical filter to be used on top of the pixels in accordance with an embodiment of a pixel cell using red, green and blue color filters.

FIG. 5 shows transmission characteristics of an exemplary transmission filter in accordance with an embodiment of a pixel cell 10. The graph shows relative transmission T versus wavelength. This transmission filter is to be used on top of the image sensor. It suppresses light beyond the visible band or the band of an active illuminator (e.g. at 940 nm). The filter transmits the visible light for the RGB color image (to be read in the rolling shutter or in the global shutter mode of operation) and the near-infrared light for the active illumination to be read in global shutter mode.

The transmission filter may be configured to transmit light in a certain wavelength range of the visible domain, for example with an upper cutoff wavelength of 600 nm, and in addition transmit a certain portion of light in the near-infrared band, for example including 940 nm. Other wavelengths are blocked by the filter, for example by absorption or reflection. Preferably, different color filters of a pixel cell 10 may have different transmission characteristics in the visible band but share the same transmission characteristics in the near-infrared band.

In other embodiments, not shown, the top die has color filters on the pixels which also include a blocking filter of the near infrared in some of the 4 pixels, whilst some other pixels have no infrared blocking filter, but a filter that blocks the visible band. The NIR block filter on pixels sensitive only to the visible band may be on top of or below the RGB color filter or may be part of the RGB color filter. The pixels sensitive to the visible light are read out in rolling shutter mode, the pixels sensitive to the infrared light are read out in global shutter mode as described in the application.

FIG. 6 shows an exemplary timing diagram of a pixel array in a rolling shutter mode of operation as it is employed in the prior art. A frame readout time comprises non-simultaneous, but typically overlapping and equally long, exposure times of individual pixels or pixel rows of the pixel array. In general, the shift in time between one pixel, or pixel row and the next is defined by the readout time required to transfer charges from the pixel to the sense node of the pixel array. As soon as one frame is completed, the process may start over again for acquisition of a subsequent frame.

FIG. 7 shows an exemplary timing diagram of a pixel array in a global shutter mode of operation as it is employed in the prior art. In contrast to the timing diagram shown in FIG. 6, the exposure times of individual pixels or pixel rows of the pixel array occur simultaneously and are equal in length. At the end of the exposure time, the charges from all pixels or pixel rows of the pixel array are transferred simultaneously and combined at the sense node of the pixel array. Typically, a global shutter mode of operation is used in combination with active illumination of the object or the scene to be captured, for example by means of a flash from a high-intensity light source. The illumination may occur at the beginning or at a predefined point within the exposure time.

The rolling shutter and the global shutter modes of operation, as shown in FIGS. 6 and 7, lay the foundation for the working principle of the present disclosure, in which the two modes are applied at the level of individual pixels of a pixel cell to allow for image capturing under different circumstances and with different requirements, as detailed throughout the description.

The invention claimed is:

1. A pixel cell comprising:
a pixel set with a plurality of pixels, with each pixel comprising a photodiode and a transfer gate coupled to the photodiode; and
a readout circuit comprising
a floating diffusion with an adjustable capacitance coupled to all of the transfer gates;
a column output line;
a sample-and-hold stage (SHS) coupled to the floating diffusion, the sample-and-hold-stage comprising a first storage stage and a second storage stage arranged in series or in parallel, each of the first and second storage stages comprising a switch and a capacitor that is coupled between the switch and a fixed potential;
a first switch coupling the sample-and-hold-stage to the column output line; and
a second switch coupling the floating diffusion to the column output line or to a further column output line, wherein
the readout circuit is configured to:
in a global shutter mode of operation, control the plurality of pixels such that corresponding charges generated by the photodiode of each of the plurality of pixels in response to incident radiation are simultaneously transferred to the floating diffusion in accordance with transfer control signals simultaneously transmitted to the transfer gates;
in a rolling shutter mode of operation, control the plurality of pixels such that corresponding charges generated by the photodiode of each of the plurality of pixels in response to incident radiation are sequentially transferred to the floating diffusion in accordance with transfer control signals sequentially transmitted to the transfer gates; and
adjust the capacitance of the floating diffusion such that the capacitance of the floating diffusion in the global shutter mode is larger than the capacitance of the floating diffusion in the rolling shutter mode;
wherein the pixel set is operated
in the global shutter mode for charges generated by the photodiode of each of the plurality of pixels based on incident radiation in a first wavelength range, wherein the first wavelength range is a near-infrared range; and
in the rolling shutter mode for charges generated by the photodiode of each of the plurality of pixels based on incident radiation in a second wavelength range;
wherein the capacitance of the floating diffusion in the global shutter mode is larger than the capacitance of the floating diffusion in the rolling shutter mode by a factor that is equal to the number of pixels in the pixel cell.

2. The pixel cell according to claim 1, wherein the readout circuit is further configured, in the global shutter mode of operation, to
generate a global shutter output signal depending on the corresponding charges from the photodiode of each of the plurality of pixels, in particular depending on a sum or an average of said corresponding charges from the photodiode (PD1-PD4) of each of the plurality of pixels; and
transfer the global shutter output signal to the column output line in accordance with a global shutter control signal transmitted to the first switch; and
is configured, in the rolling shutter mode of operation, to
generate individual rolling shutter output signals, with each rolling shutter output signal depending on the corresponding charges from the photodiode of one of the plurality of pixels; and
transfer the individual rolling shutter output signal to the column output line or to the further column output line in accordance with a rolling shutter control signal transmitted to the second switch.

3. The pixel cell according to claim 1, wherein the pixel set is exclusively operated,
in the global shutter mode for charges generated by the photodiode of each of the plurality of pixels based on incident radiation in a near-infrared range including 940 nm; and
in the rolling shutter mode for charges generated by the photodiode of each of the plurality of pixels based on incident radiation in a visible range.

4. The pixel cell according to claim 1, further comprising the further column output line, wherein the further column output line is configured as a rolling shutter column output line and the column line is configured as a global shutter column output line.

5. The pixel cell according to claim 1, further comprising a color filter arrangement of filters, wherein
each filter acts as a bandpass filter for a distinct wavelength range such that each of or a majority of pixels of the pixel set comprises a distinct color filter; and
the filters act as bandpass filters for a further wavelength range.

6. The pixel cell according to claim 1, wherein the pixel set comprises
three pixels; or
four pixels.

7. The pixel cell according to claim 1, wherein each of the plurality of pixels is equal in size and has a footprint smaller than 2 μm×2 μm.

8. The pixel cell according to claim 1, wherein the capacitance of the floating diffusion is adjustable by means of a switch.

9. An image sensor comprising a plurality of pixel cells according to claim 1, in particular a CMOS image sensor.

10. The image sensor according to claim 9, wherein the image sensor is configured to operate in a global shutter mode of operation for three dimensional imaging of an object or a scene.

11. An electronic device with a camera system comprising an image sensor according to claim 9.

12. A method for operating the pixel cell according to claim 1, wherein each of the plurality of pixels is configured to capture optical information incident upon the respective pixel and generate electrical information representative of the optical information, the method comprising:
collecting and outputting the electrical information from each of the plurality of pixels; and
operating the pixel set in the global shutter mode and in the rolling shutter mode; wherein
in the global shutter mode of operation the electrical information from each of the plurality of pixels is combined, in particular as a sum or average, for generating a global shutter output signal; and
in the rolling shutter mode of operation the electrical information from each of the plurality of pixels is used to generate individual rolling shutter output signals.

13. The pixel cell according to claim 1, further comprising a color filter arrangement of filters, wherein
each filter acts as a bandpass filter for a distinct wavelength range of red, green or blue light, such that each of or a majority of pixels of the pixel set comprises a distinct color filter; and
the filters act as bandpass filters for a further wavelength range of infrared light.

14. The pixel cell according to claim 1, wherein each of the plurality of pixels is equal in size and has a footprint equal to or smaller than 1.4 µm×1.4 µm.

15. The pixel cell according to claim 1, wherein the fixed potential is the same for both the first and second storage stages.

16. An imaging system, comprising:
An infrared light source; and
an image sensor comprising a plurality of pixel cells, wherein the light source is configured to operate in combination with the image sensor, each pixel cell comprising:
a pixel set with a plurality of pixels, with each pixel comprising a photodiode and a transfer gate coupled to the photodiode, and with each pixel being sensitive to a near-infrared wavelength range including 940 nm and to at least part of a visible wavelength range; and
a readout circuit comprising:
a floating diffusion with an adjustable capacitance coupled to all of the transfer gates;
a column output line;
a sample-and-hold stage (SHS) coupled to the floating diffusion, the sample-and-hold-stage comprising a first storage stage and a second storage stage arranged in series or in parallel, each of the first and second storage stages comprising a switch and a capacitor that is coupled between the switch and a fixed potential;
a first switch coupling the sample-and-hold-stage to the column output line; and
a second switch coupling the floating diffusion to the column output line or to a further column output line, wherein the readout circuit is configured to:
in a global shutter mode of operation,
control the plurality of pixels such that corresponding charges generated by the photodiode of each of the plurality of pixels in response to incident radiation are simultaneously transferred to the floating diffusion in accordance with transfer control signals simultaneously transmitted to the transfer gates;
generate a global shutter output signal depending on the corresponding charges from the photodiode of each of the plurality of pixels; and
transfer the global shutter output signal to the column output line in accordance with a global shutter control signal transmitted to the first switch;
in a rolling shutter mode of operation,
control the plurality of pixels such that corresponding charges generated by the photodiode of each of the plurality of pixels in response to incident radiation are sequentially transferred to the floating diffusion in accordance with transfer control signals sequentially transmitted to the transfer gates;
generate individual rolling shutter output signals, with each rolling shutter output signal depending on the corresponding charges from the photodiode of one of the plurality of pixels;
transfer the individual rolling shutter output signal to the column output line or to the further column output line in accordance with a rolling shutter control signal transmitted to the second switch; and
adjust the capacitance of the floating diffusion such that the capacitance of the floating diffusion in the global shutter mode is larger than the capacitance of the floating diffusion in the rolling shutter mode:
wherein the image sensor is operated:
in the global shutter mode for charges generated by the photodiode of each of the plurality of pixels based on incident radiation in a near-infrared wavelength range, wherein the infrared light source is employed for projecting a pattern onto an object or a scene; and
in the rolling shutter mode for charges generated by the photodiode of each of the plurality of pixels based on incident radiation in the visible wavelength range;
wherein the capacitance of the floating diffusion in the global shutter mode is larger than the capacitance of the floating diffusion in the rolling shutter mode by a factor that is equal to the number of pixels in the pixel cell.

* * * * *